(12) United States Patent
Sugasawara

(10) Patent No.: US 6,185,706 B1
(45) Date of Patent: Feb. 6, 2001

(54) PERFORMANCE MONITORING CIRCUITRY FOR INTEGRATED CIRCUITS

(75) Inventor: Emery O. Sugasawara, Pleasanton, CA (US)

(73) Assignee: LSI Logic Corporation, Milpitas, CA (US)

(*) Notice: Under 35 U.S.C. 154(b), the term of this patent shall be extended for 0 days.

(21) Appl. No.: 09/097,081

(22) Filed: Jun. 12, 1998

(51) Int. Cl.[7] .................................................. G01R 31/28
(52) U.S. Cl. .................................... 714/724; 716/4; 716/5
(58) Field of Search ............................... 700/121; 716/4, 716/5, 6; 713/500; 714/30, 37, 39, 45, 724, 726

(56) References Cited

U.S. PATENT DOCUMENTS

| | | | |
|---|---|---|---|
| 5,068,547 | 11/1991 | Gascoyne | 307/443 |
| 5,226,048 * | 7/1993 | Bandali et al. | 714/724 |
| 5,486,786 | 1/1996 | Lee | 327/378 |
| 5,619,461 * | 4/1997 | Roohparvar | 365/201 |
| 5,663,967 | 9/1997 | Lindberg et al. | 371/26 |
| 5,802,270 * | 9/1998 | Ko et al. | 714/27 |
| 6,092,226 * | 7/2000 | Kramer et al. | 714/727 |

OTHER PUBLICATIONS

LSI Logic Corporation, "Process Monitor (PROCMON) Cell", Feb. 1997, pp. 1–12, DB06–000042–05, Copyright © 1995, 1996 & 1997.

* cited by examiner

*Primary Examiner*—Dennis M. Butler (57) ABSTRACT

Process monitoring circuitry according to the invention incorporates test structures placed across an integrated circuit die to monitor the performance of the fabrication process across the die. The integrity of the semiconductor fabrication process used to manufacture a particular integrated circuit is ascertained by comparing data extracted the test structures by automated test equipment (ATE) to simulation values. In one embodiment in the invention, the process monitoring circuitry comprises inverters arranged in a generally linear fashion. The inverters may be composed of simple CMOS inverters or other logic gates configured as inverters. The logic gates are arranged in horizontal and/or vertical test paths in which the gates are disposed across various sections of the integrated circuit die. An input test pad and an output test pad for each test path are provided at opposing sides of the integrated circuit die. In one alternate embodiment of the invention, multiplexing circuitry is utilized at the input and output test pads in order to minimize the impact of the process monitoring circuitry. The various test paths may incorporate comparatively lengthy metal routing lines, allowing accurate measurement of metal interconnect delays.

21 Claims, 4 Drawing Sheets

PERFORMANCE MONITORING CIRCUITRY FOR INTEGRATED CIRCUITS

BACKGROUND OF THE INVENTION

1. Field of the Invention

The present invention relates to performance testing of semiconductor devices, and more particularly to process monitor structures for accurately predicting the across-the-die performance of an integrated circuit die.

2. Description of the Related Art

Improvements in semiconductor processes are making possible integrated circuits of increasing size and complexity. The semiconductor processing technologies that produce these integrated circuits have advanced to the point where complete systems can now be reduced to a single integrated circuit or application specific integrated circuit (ASIC) device. These integrated circuits (also referred to as "die" or "chips") may use many functions that previously could not be implemented on a single die. It is a common practice for the manufacturers of such integrated circuits to thoroughly test device functionality at the manufacturing site. However, due to the complex nature of today's integrated circuits and a concomitant sensitivity to variations in manufacturing processes, manufacturers are constantly confronted with new testing challenges.

In addition, interconnecting the millions of transistors that may be present on a chip also poses difficulties. To aid in this task, new multiple layer metallization schemes have been developed that allow up to five or more distinct "levels" or layers of metal interconnect wires. In such multiple layer metallization schemes, the various metal interconnect wires typically have different nominal widths and heights, different distances from transistor gates, and are insulated by oxide layers of varying thickness. These differences in the physical properties of the metal layers cause different metal layers to exhibit somewhat dissimilar electrical characteristics, resulting in disparities in propagation delays that a signal experiences when communicated over routing wires formed from the different metal layers.

Often, the performance of the integrated circuitry can be dominated by propagation delays through longer metal interconnect wires rather than the basic gate delays of individual logic elements. This phenomenon is exacerbated by the fact that as the width of a wire shrinks in deep submicron designs, the resistance of the wire may increase more rapidly than capacitance decreases. An increase in average propagation delays frequently results in a greater number of critical timing paths (e.g., signal paths in which best or worst case simulated propagation delays may approach the limits required for proper functionality). Many circuit timing problems involve such critical timing paths.

In order to avoid timing and other problems, integrated circuits are typically simulated in a software environment, using a variety of CAE tools, before the integrated circuits are actually fabricated. Such simulations function to reduce costly physical design iterations because modifications to an integrated circuit design are more readily achieved in software. Given the complexity of today's integrated circuits, accurate simulation is thus essential to a successful integrated circuit design.

Following fabrication of an integrated circuit, testing is performed to insure that the integrated circuit functions as designed. Although the integrated circuit may work functionally, it may not operate at the clock frequency at which it was designed to operate. Certain testing methodologies are employed to verify that the integrated circuit works "at speed." One such method is to test all circuitry functionally at the highest frequency at which the integrated circuit is designed to operate. At speed testing is typically not performed, however, because it is extremely difficult to create test patterns to check integrated circuits at high frequencies. Further, specialized testers are also required.

As a result, another method used to verify at speed functionality involves measuring predetermined critical paths and assume that if these critical paths meet the timing specifications, all other paths are within specification. However, identification and measurement of critical paths is sometimes difficult.

To address these difficulties, process monitoring circuitry has been developed that resides on the integrated circuit itself. One such process monitor is the "PROCMON" cell developed by LSI Logic Corporation of Milpitas, Calif. The PROCMON circuits are analyzed during testing and their performance serves as a parametric indication of the integrity of the manufacturing process.

In complementary metal-oxide-semiconductor (CMOS) circuits, the performance of the integrated circuit depends on the performance of both p-channel (PMOS) and n-channel (NMOS) transistors. Since the PMOS and NMOS transistors are formed at different stages of the manufacturing process, process variations at a given step may not affect the PMOS and NMOS transistors equally. The PROCMON cell includes a short and long delay paths providing a first edge delay pulse in response to a logic level high to a logic low transition signal at the input terminal, and providing a second edge delay pulse when a logic low to logic high transition signal is provided at the same input terminal. The differences between the edge delay pulses are indicative of the relative performance of the PMOS and NMOS transistors being monitored.

However, given the increased length of routing that is frequently encountered in today's integrated circuits, the PROCMON cell may not take into account delays associated with long metal lines and/or a multitude of vias in certain delay paths. The PROCMON cell does monitor "short" and "long" signal paths, however the "long" signal path is typically contained within the cell itself and may not reflect actual routing. Because the long metal paths are contained within the PROCMON cell, length of routing and the number of vias that can be utilized are also limited. In addition, process monitor circuits such as the PROCMON cell are typically routed in the first layer of interconnect metal. Therefore, if a process problem develops that effects the resistance or capacitances of different metal layers or vias, the current process monitors may not detect such problems.

Further, the relatively compact size and localized placement of current process monitor structures do not allow these structures to provide information reflecting across-the-die manufacturing process variations. With the current circuitry, the assumption is made that the process is uniform across the die. The performance of transistors is, to the first order, mainly determined by the critical dimension of transistor polysilicon gate lengths. Unfortunately, the uniformity of the critical dimension of the polysilicon gate lengths is not always within acceptable limits across a die due to a variety of possible process and equipment variations.

SUMMARY OF THE INVENTION

Briefly, performance monitoring circuitry according to the present invention includes test structures placed across the integrated circuit die to monitor performance of the silicon across the die. Process variations that effect the performance of transistors and routing can thus be detected, even if such variations are localized in nature.

More specifically, by monitoring the performance of standard inverters (or other logic gates configured as inverter circuits) dispersed across an integrated circuit, the integrity of the semiconductor process used to manufacture a particular integrated circuit can ascertained through comparison to simulations values for the logic gates. This information can be used to determine whether any process induced problems could effect the performance of the integrated circuit in its final application. If mismatches between silicon and simulations are discovered, the invention allows for a determination as to whether the mismatches are attributable to N-channel transistors, P-channel transistors or other process issues.

In one embodiment in the invention, inverters are arranged in such a fashion that across-the-die performance checks can be performed by a functional tester. The inverters may be composed of simple CMOS inverters or NAND/NOR logic gates configured as inverters. The logic gates are arranged in horizontal and/or vertical test paths in which the gates are disposed across the integrated circuit die. An input test pad and an output test pad for each test path are provided at opposing sides of the integrated circuit die. In one alternate embodiment of the invention, multiplexing circuitry is utilized at the input and output test pads in order to minimize the impact of the test path circuitry.

Preferably, various test paths according to the invention are placed strategically across the integrated circuit die in order to monitor the performance of the chip in "sections." For example, a pair of NAND and NOR gate test paths can be placed at the top, middle and bottom of the integrated circuit die in a horizontal fashion, and likewise in a vertical fashion. Arranging the test paths in such a manner provides several pieces of information, including: across-the-die uniformity of typically used transistors, variations in x-direction or y-direction polysilcon gate lengths (gate lengths may vary as a function of orientation in the semiconductor manufacturing process), and whether the P-channel or N-channel transistors are affected differently by process variations. Furthermore, because the various test paths incorporate comparatively lengthy metal routing lines, metal interconnect delays can also be more accurately ascertained.

Each test path is simulated via specialized software tools and the resulting simulation delay value(s) is compared to a test measurement(s) extracted by the functional tester during a manufacturing test procedure. If the extracted measurement(s) for all of the test paths fall within an expected range of values, the semiconductor process is assumed to be within specification for all portions of the integrated circuit.

Thus, performance monitoring circuitry according to the present invention improves the fault coverage provided by the testing procedures for an integrated circuit by providing information regarding the effect of process variations across the integrated circuit die, and may be utilized as a surrogate for observable path testing.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1A:
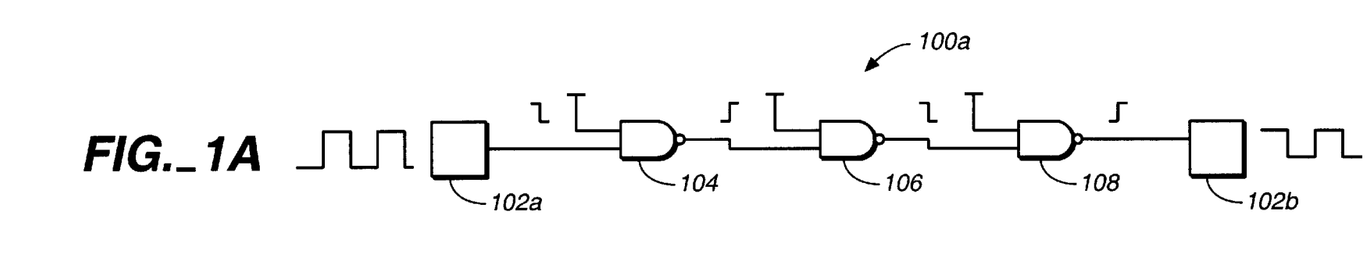
FIGS. 1A, 1B and 1C are schematic diagrams providing exemplary details of performance monitoring tests paths according to the present invention.
Figure 1B:
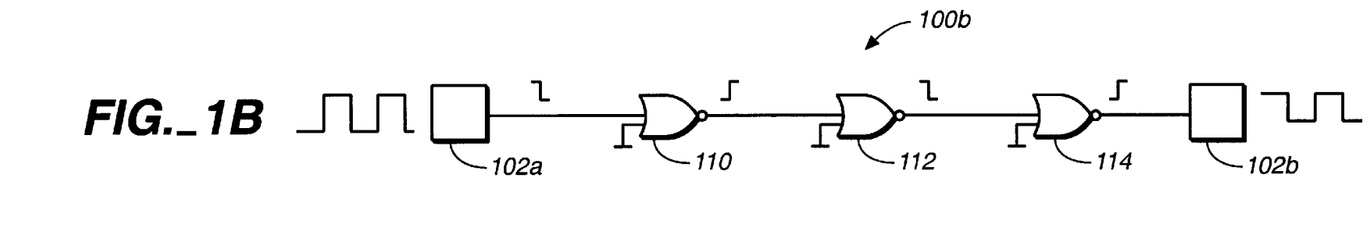
Figure 1C:
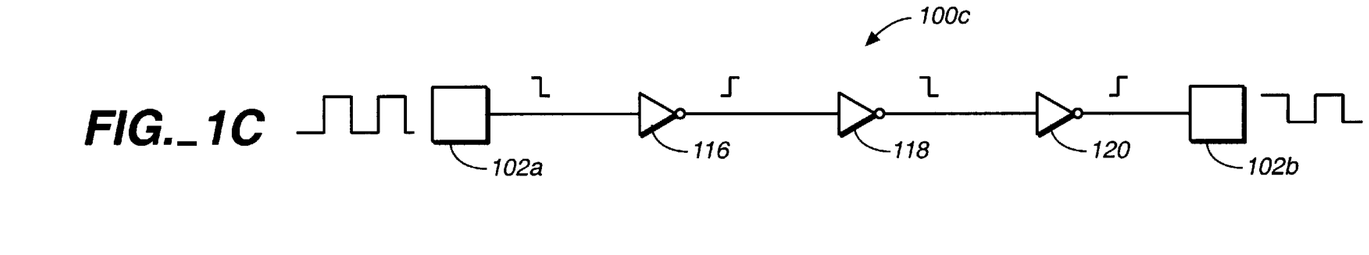

Referring now to the drawings, FIGS. 1A–1C are schematic diagrams providing exemplary details of performance monitoring test paths 100 according to the present invention. The illustrated test paths 100 utilize digital logic gates such as NAND gates, NOR gates and inverters, although many different configurations are possible. The precise implementation of the logic gates is not considered critical to the invention.

In order for an integrated circuit IC fabricated in a complementary metal-oxide-semiconductor (CMOS) process to operate properly, the relative electrical characteristics of the NMOS and PMOS transistors which form logic gates generally need to be within specified ranges. The relative qualities of the NMOS and PMOS devices, measured in terms of a figure of merit, is known in the art as the "process factor." Typically, the process factor is directly related to the switching speed of the devices.

As know to those skilled in the art, however, there are numerous causes of process non-uniformity. For example, it is possible that process gasses may not be sufficiently mixed. Other issues, such as photolithography resolution informalities, may be manifested by circuit non-uniformities. During the manufacture process, integrated circuit die or groups of dies are fabricated in steps. As mentioned, a particular die's location in the exposure field may result in non-uniformity of polysilicon gates. In addition, optical issues inherit in the manufacturing equipment may change critical dimensions in a non-uniform manner across the integrated circuit die.

There are numerous such parameters that can be varied during fabrication to cause NMOS devices to have higher merit, or be stronger, than PMOS devices and vice-versa. For this reason, the test paths 100 that are integrally fabricated within the integrated circuit IC preferably include logic gates formed of NMOS and PMOS transistors that are identical to those in the normal logic gates integrated circuit IC. The test paths 100 of the disclosed embodiment of the invention are accessible via the standard input/output (I/O) pads 102 of the integrated circuit IC, and enable measurement of the process factor prior to and following packaging of the integrated circuit IC.

As described below, the test paths 100 circuitry utilizes the fact that electrons move faster than holes—thus P-channel transistors are almost always slower than N-channel transistors of equal size. More specifically, due to the slower carrier mobility of PMOS transistors as compared to NMOS transistors, certain types of CMOS logic gates, such as some inverters and NOR gates, produce output pulses in response to input pulses in which the rising (positive-going) edges are sharper (delayed less) than the falling (negative-going) edges. This is due to the fact that the pull-up transistors in these logic gates are PMOS, whereas the pull-down transistors are NMOS. The PMOS pull-up transistors pull up to the logic high level slower than the NMOS pull-down transistors pull down to the logic low level, thereby creating rising edge delays that are longer than falling edge delays. These differences are manifested in the edge delay pulses of the output signals of the test paths 100. The differences in delay times between the test paths 100 indicate the relative strength of the two types of transistors, and are compared to test limits based on device-level simulation results.

To determine test limits, process parameters are varied in the simulations to vary the relative strengths of the NMOS and PMOS transistors. Preferably, simulations having each of the following characteristics are performed: strong NMOS and weak PMOS transistors, weak NMOS and strong PMOS transistors, strong NMOS and strong PMOS transistors, and weak NMOS and weak PMOS transistors. Nominal transistor strengths, as well as potential variations in the electrical characteristics of the different layers of interconnect metal and vias may also be included in the simulations. Preferably, three-dimensional device-level simulations of all of the components of the delay paths is performed. Further details of exemplary simulations for monitoring process variations can be found in commonly-assigned U.S. patent application Ser. No. 09/013,510, entitled "IMPROVED PROCESS MONITOR CIRCUITRY FOR INTEGRATED CIRCUITS," which is hereby incorporated by reference for all purposes as if set forth in its entirety.

The values of the simulations under the various conditions are used to determine the conceptual limits of acceptable process variation for the four extreme combinations of NMOS and PMOS transistors (as well as metallization variations). In order for an integrated circuit IC to pass parametric testing, the measured outputs of the test paths 100 must fall within the limits established via simulation. Extreme process variations cause the values provided by the test paths' 100 circuitry to fall outside the set of permissible tester values and fail testing. In other words, the combination of delay and transistor parametric measurements represented by the pulses measured at the bond pads 102b are analyzed and compared with simulated values to determine if the integrated circuit IC is likely to function as designed.

Referring more specifically to FIG. 1A, a test path 100a comprised of NAND gates 104–108 is illustrated. Test inputs to the test path 100a are provided at an input bond pad 102a, while outputs of the test path 100a are measured at an output bond pad 102b. As more clearly shown in FIG. 2, the input bond pad 102a and the output bond pad 102b are preferably disposed on opposite sides of an integrated circuit die IC. The term bond pad (or "bonding pad") refers herein to a relatively large metallic area positioned on a planar surface of the integrated circuit IC. Bond pads 102 function to provide electrical contact between the integrated circuit IC and a leadframe (not shown), typically via bond wires or "solder-bump/micro-bump" connections. The performance monitoring circuitry of the disclosed embodiment of the invention preferably utilizes the output bond pad 102b to provide output pulses to automated testing equipment.

The NAND gates 104, 106, and 108 of FIG. 1A are preferably configured to function as inverter circuits, with one input of each NAND gate 104, 106, and 108 being tied to a logic high level. Test signal inputs provided at bond pad 102a are received by one input of the NAND gate 104, whose output drives an input of the NAND gate 106. In turn, the output of NAND gate 106 drives one input of the NAND gate 108, whose output is provided to output bond pad 102b. In this configuration, each NAND gate 104–108 produces a logic high output when the driven input signal is at a logic low level, and will produce a logic low output when the driven input signal is at a logic high level. Thus, a series of pulses applied at the input bond pad 102a result in a series of pulses at the output bond pad 102b. As mentioned, differences between edge delay pulses are indicative of the relative performance of the PMOS and NMOS transistors being monitored.

Referring now to FIG. 1B, a test path 100b comprised of NOR gates is illustrated. Again, the bond pads 102a and 102b are preferably spaced on opposing sides of the integrated circuit IC. One input of each of the NOR gates 110–114 is tied to a logic low level. As with the NAND gates 104–108 of FIG. 1B, the other input of each of the NOR gates 110–114 is driven by either a signal applied at an input bond pad 102a, or the output of another NAND gate. When utilized in this manner, a logic high signal at the driven input of a NOR gate 110–114 will produce a logic low level at its output, and vice-versa.

Referring now to FIG. 1C, a test path 100c comprised of inverters 116–120 is depicted. The inverters are connected in a series configuration between an input bond pad 102a and an output bond pad 102b. As with the test paths 100a and 100b, a test signal pulse at the input bond pad 102a will produce a test signal output pulse at the output bond pad 102b. In the illustrated embodiment, the input of inverter 116 is driven by a signal applied at the input bond pad 102a, while the output of the inverter 116 drives the input of inverter 118. The output of inverter 118 is provided to the inverter 120, whose output drives a test signal onto the output bond pad 102b.

Figure 2:
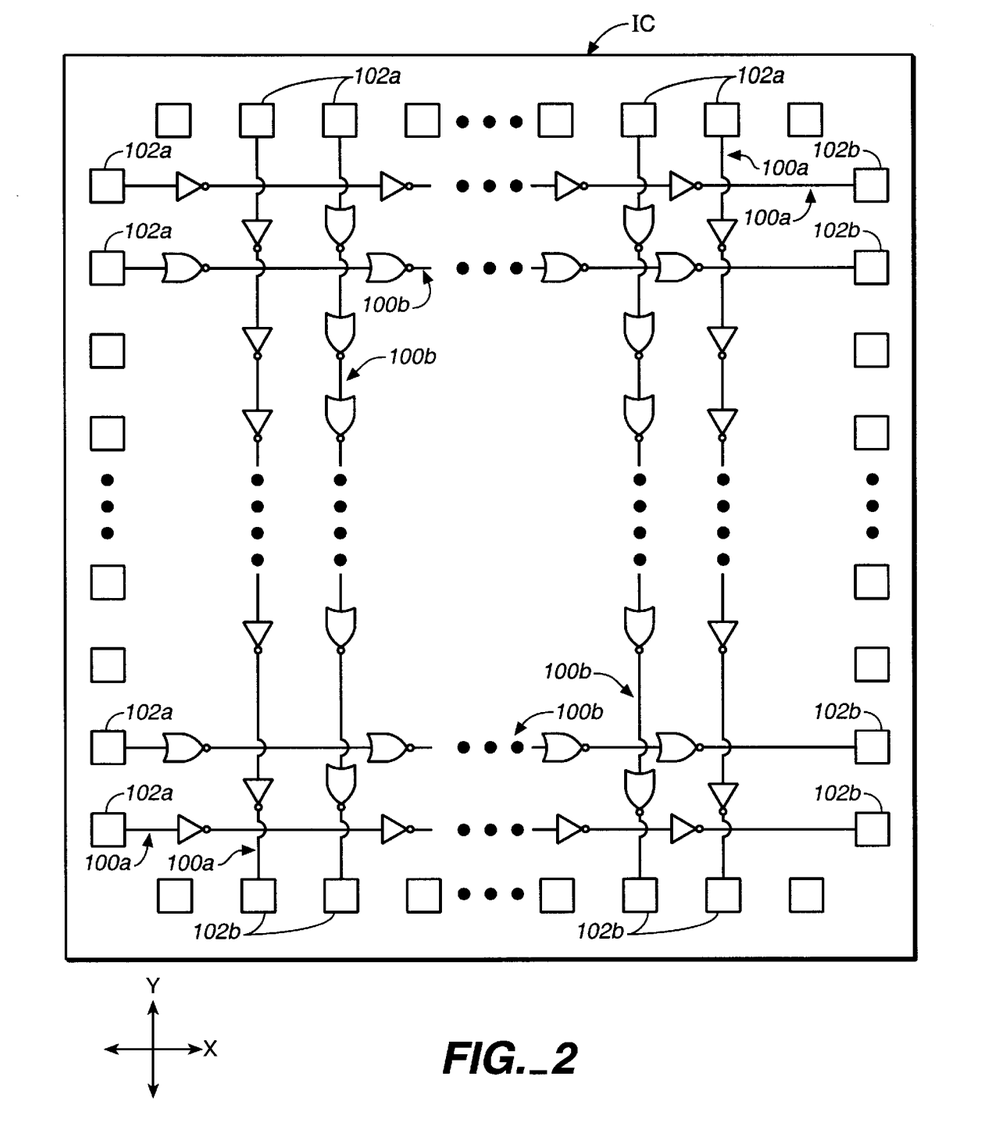
FIG. 2 is a schematic plan view of an exemplary integrated circuit die including performance monitoring test paths in accordance with the present invention.

Referring now to FIG. 2, a schematic plan at view of an exemplary integrated circuit IC including performance monitoring test paths 100 in accordance with the present invention as shown. The test paths 100 are placed strategically across the integrated circuit IC such that process variations can be monitored in "sections", thereby allowing localized process anomalies to be isolated.

The bond pads 102 used in the test paths 100 are commonly incorporated in layout structures known as "pad cells" (not separately illustrated). The pad cells are typically disposed in rows about the periphery of the integrated circuit IC in a ring shaped area between a core logic region and a scribe line (not separately illustrated). In addition to the bond pad 102, pad cells customarily include electrostatic discharge (ESD) protection circuitry and I/O circuitry such as pad drivers, slew rate control circuitry, and current spike suppression logic.

One reason for placing bond pads 102 around the periphery of an integrated circuit IC is that such placement permits a large number of I/O connections to the integrated circuit IC without unnecessarily long or crossing bond wires. Bond pad 102 pitch and associated packaging concerns are sometimes addressed by using special bonding techniques, such as "wedge-wedge" bonding (utilizing wedge-shaped bonding pads) and "double-tier" bonding. Also, a number of packaging technologies exist that permit reduced bond pad pitches, such as "flip-chip" (wherein connections are made to bump contacts covered with conductive bonding agent on the face of a hybrid circuit) and tape automated bonding (TAB).

In order to reduce bond pad 102 pitch, semiconductor manufacturers have also created "staggered" bond pads 102. In a staggered bonding approach, two staggered and substantially parallel rows of bond pads 102 are provided rather than the more conventional single row, in-line arrangement that is illustrated. It is contemplated that performance monitoring circuitry according to the invention can be utilized with any of the aforementioned bonding schemes.

In the embodiment of the invention shown in FIG. 2, test paths 100a and 100b are placed at the ends of the integrated circuit IC in both the x- and y-directions. Although not explicitly illustrated, additional test paths 100 may be located in the middle of the integrated circuit IC in both the x- and y-directions. Arranging the test paths 100 in such a manner provides several key pieces of information, including the across-the-die uniformity of typically used transistors as well as variations in x-direction or y-direction polysilcon gate lengths (gate lengths may vary as function of orientation in semiconductor manufacturing processes). Further, because the various test paths 100 incorporate comparatively lengthy metal routing lines, metal interconnect delays can also be more accurately ascertained.

The test paths 100 which are placed in a generally horizontal (x) direction provide vertical resolution of process problems, while the test paths 100 which are placed in a vertical (y) direction provide horizontal resolution of process problems. As a result, corresponding problems detected in intersecting horizontal and vertical test paths 100 may indicate a problem in a specific region of the intersection between the given test paths 100.

In operation, test signals are applied to each of the input bond pads 102a for each of the test paths 100, with the outputs being measured at the output bond pads 102b by automated test equipment (ATE). If the signals measured at the test output pad 102b indicate a process deviation, the integrated circuit IC can be marked as faulty. The dispersed nature of the test paths 100 further allow isolated regions of substandard processing to be readily isolated.

Although the logic gates of the test paths 100 are shown arranged in a generally linear fashion, in practice the logic gates can be arranged in a non-linear manner in order to conform with the requirements of the place-and-route or other layout tools used to generate the physical design of the integrated circuit IC. The CAD tools used to design the integrated circuit IC may need to be modified to allow the logic gates of the test paths 100 to be placed within predetermined ranges of locations that may conflict with the normal design constraints of such tools.

Further, the various test paths 100 incorporate comparatively lengthy metal routing lines. The metal routing lines preferably approximate the metal interconnect delays in typical signal paths of the functional design, thereby allowing the test paths 100 to accurately predict the performance of the signal paths of a completed integrated circuit IC. To this end, the metal routing lines coupling the logic gates of the test paths 100 preferably include all available layers of metal that are typically used in signal routing in the integrated circuit IC. These metal routing lines are placed on the integrated circuit IC such that impact to other metal signal lines/vias used in the actual design is minimized.

In most semiconductor processes, the various metal routing lines formed on different layers have different nominal widths and heights, different distances from transistor gates, and are insulated by oxide layers of varying thickness. These differences result in variations in the resistance per unit length and capacitance values associated with the metal routing lines. Other process-related parameters, such as via resistances, may also differ. All of the aforementioned parameters may effect the propagation delay that a signal experiences on a given metal layer. Incorporating realistic metal routing lines in the test paths 100 provides some indication of process variations which may impact the electrical characteristics of metal routing lines.

As will be apparent to those skilled in the art, however, the present invention could be utilized with any number of metal interconnect layers or fabrication process other than CMOS, such as Bi-CMOS. Further, the various interconnect metal layers may be formed of a variety of materials, including aluminum, copper or any suitable conductive alloy.

Figure 3:
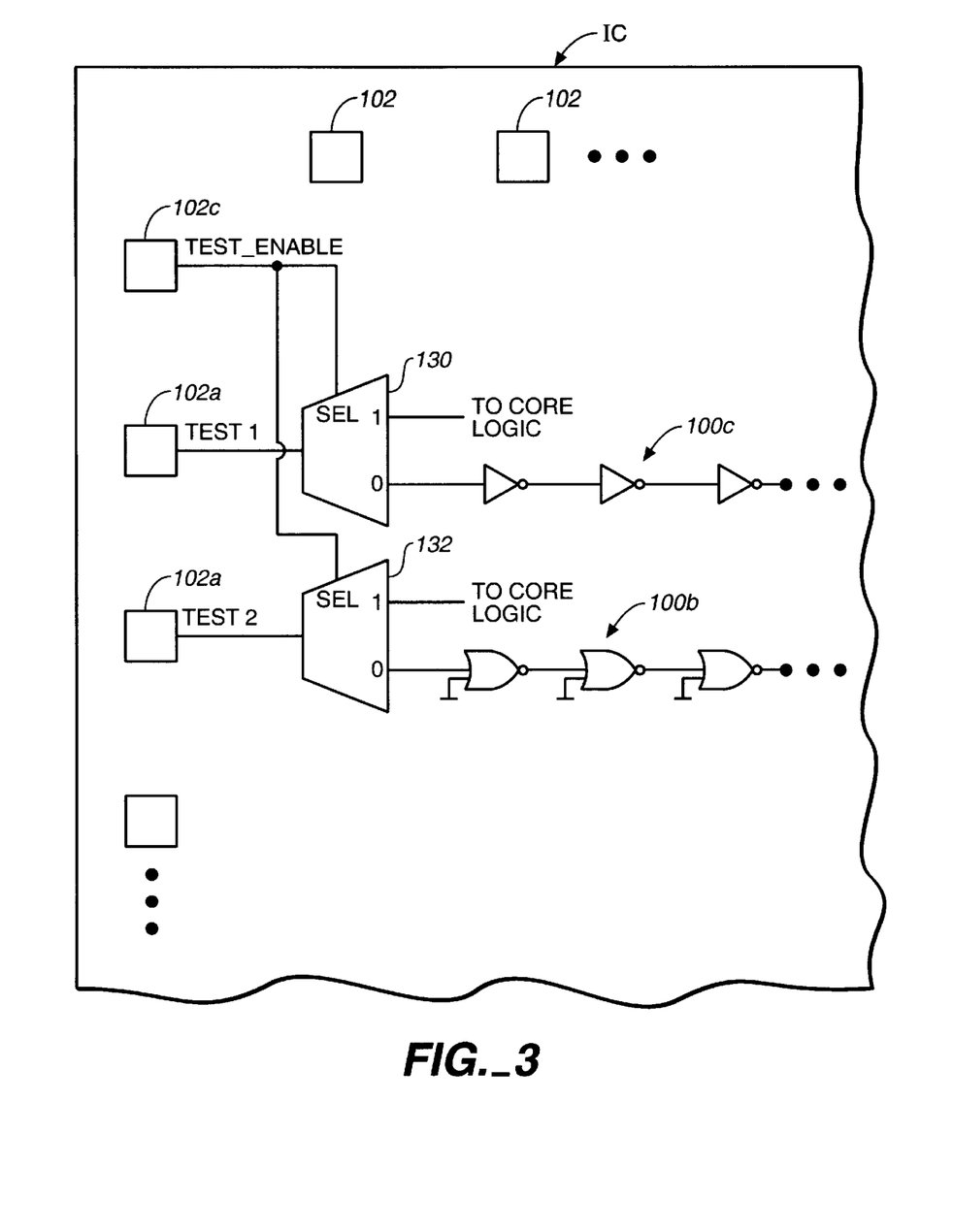
FIG. 3 is a schematic plan view of a portion of an exemplary integrated circuit die including performance monitoring test paths and multiplexing circuitry according to the present invention.

Referring now to FIG. 3, a schematic plan view of a portion of an exemplary integrated circuit IC including performance monitoring test paths 100 and multiplexing circuitry is shown. In many cases, integrated circuit IC size and packaging limitations may not permit the test paths 100 to be provided with dedicated input and output bond pads 102a and 102b. For example, in a 0.5 micron process, an integrated circuit IC die measuring one centimeter per side may only have space for approximately 100 bond pads 102, all of which may be required by the circuitry of the end product. Maximizing use of the bond pads 102 is desirable in such pad-limited designs. For this and other reasons, multiplexing circuitry is provided to allow for multiple uses of the input bond pads 102a. Although the multiplexing circuitry is illustrated at input bond pads 102a, it is contemplated that similar circuitry could be provided at the output bond pads 102b.

In the disclosed embodiment of the multiplexing circuitry, first and second test signals TEST1 and TEST2 are provided to the inputs of 2:1 multiplexers 130 and 132, respectively. The first test signal TEST1 is provided or utilized by the test pad 100c, while the second test signal TEST2 is used by the test path 100b. The 2:1 multiplexers 130 and 132 also allow normal input signals to be provided to the core logic (not separately illustrated) via the input bond pads 102a. In operation, a test enable signal TEST_ENABLE is provided by an input bond pad 102c to control operation of the 2:1 multiplexers 130 and 132.

The test enable signal TEST_ENABLE drives the control input SEL of the 2:1 multiplexers 130 and 132. When the test enable signal TEST_ENABLE is at a logic high level, input signals supplied to the input bond pads 102a are directed to the core logic via the "1" outputs of the 2:1 multiplexers 130 and 132. In the normal mode of operation, the "0" outputs of the multiplexers 130 and 132 are preferably placed in a known logic state in order to prevent the inputs to the logic gates of the test paths 100b and 100c from "floating", thereby avoiding undesirable current draw through the supply pads of the integrated circuit IC.

When the test enable signal TEST_ENABLE is at a logic low level, as would be the case during a specified portion of the production test program, the test signals TEST1 and TEST2 applied at the input bond pads 102a are directed to the "0" outputs of the multiplexers 130 and 132, respectively. While in a test mode, the signals provided at the input bond pads 102a are utilized in accordance with the invention as described above. In this mode, the "1" outputs of the multiplexers 130 and 132 are preferably driven to a known logic state.

Although not explicitly illustrated, multiplexing circuitry can also be provided at the outputs of the test paths 100 in order to provide greater utilization of the output bond pads 102b. This additional multiplexing circuitry can be controlled by the test enable signal TEST_ENABLE provided at the input bond pad 102c, or by other test enable signals.

Figure 4:
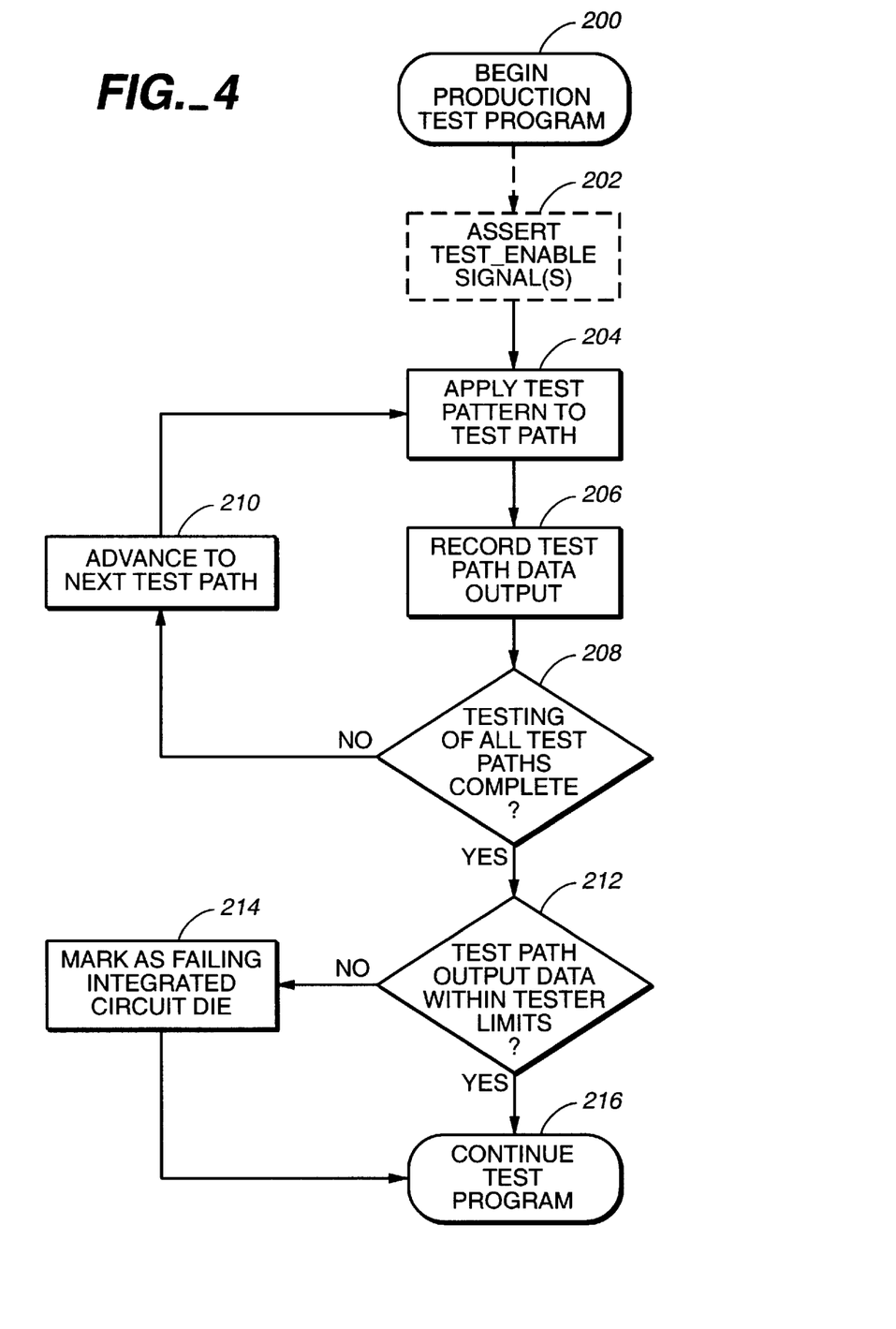
FIG. 4 is a flow chart diagram of an exemplary testing procedure utilizing the circuit of FIG. 3.

Referring now to FIG. 4, a flowchart diagram of an exemplary testing procedure utilizing the circuitry of FIG. 3 is shown. The illustrated testing procedure is preferably part of a production test program 200 executed on automated test equipment. If the optional multiplexing circuitry is utilized at the input bond pads 102a or the output bond pads 102b of the test paths 100, the relevant test enable signal(s) TEST_ENABLE is asserted in step 202. The test process proceeds to step 204, where a predetermined test pattern is applied to one of the test paths 100 of the integrated circuit IC. Next, in step 206, data output from the test path 100 under examination is recorded by the testing equipment. Control then proceeds to step 208 to determined if all of the test paths 100 have been examined. If not, the test program is advanced in step 210 to test the next test path 100. Following step 210, control of the test procedure returns to step 204.

After all the test paths 100 have been examined, output data from the test paths 100 are examined in step 212 to determine if the data is within the predetermined tester limits. If not, the integrated circuit die under examination is marked as potentially problematic in step 214. Following either step 214 or an affirmative determination in step 212, the test program is continued in step 216.

Thus, the performance monitoring circuitry described above allows process integrity to be monitored by automated test equipment during a production test program. The performance monitoring circuitry improves the fault coverage provided by the testing procedures for an integrated circuit by providing information regarding the effect of process variation across the integrated circuit die, and may be used instead of other techniques such as observable path testing.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

What is claimed is:

1. Process monitor circuitry for an integrated circuit having a core logic region and a plurality of bond pads, the integrated circuit manufactured in a semiconductor process having at least first and second types of transistors for forming logic gates, the process monitor circuitry comprising:
    an input bond pad;
    an output bond pad, the input and output bond pads disposed on opposing sides of the integrated circuit; and
    a plurality of logic gates disposed in the core logic region and coupled in series between the input bond pad and the output bond pad to form a first test path, the first test path providing output pulses at the output bond pad in response to input pulses at the input bond pad, the output pulses including information representative of the relative electrical characteristics of the first type of transistor and the second type of transistor.

2. The process monitor circuitry of claim 1, wherein the plurality of logic gates comprise logic gates disposed across the integrated circuit die at predetermined intervals to provide the information representative of the relative electrical characteristics of the first type of transistor and the second type of transistor for at least two regions of the integrated circuit.

3. The process monitor circuitry of claim 1, the plurality of logic gates being configured as inverters.

4. The process monitor circuitry of claim 3, the plurality of logic gates comprising NAND gates.

5. The process monitor circuitry of claim 3, the plurality of logic gates comprising NOR gates.

6. The process monitor circuitry of claim 1, further comprising:
    a second test path disposed in a generally perpendicular arrangement with the first test path.

7. The process monitor circuitry of claim 6, further comprising:
    a plurality of additional test paths, at least one of the additional test paths arranged in a generally parallel manner to the first test path, and at least one of the additional test paths arranged in a generally parallel manner to the second test path.

8. The process monitor circuitry of claim 7, the test paths being arranged to provide process information for substantially all sections of the integrated circuit.

9. The process monitor circuitry of claim 7, wherein the logic gates of select ones of the test paths are NAND gates configured as inverters.

10. The process monitor circuitry of claim 7, wherein the logic gates of select ones of the test paths are NOR gates configured as inverters.

11. The process monitor circuitry of claim 7, the semiconductor process utilizing multiple layers of interconnect material to form interconnect wires for signal paths between logic gates, including the logic gates of the test paths, wherein the signal paths of the test paths approximate those of typical signal paths of the integrated circuit.

12. The process monitor circuitry of claim 1, wherein the semiconductor process is a complementary metal-oxide-semiconductor (CMOS) process.

13. An integrated circuit manufactured in a semiconductor process having at least first and second types of transistors for forming logic gates, comprising:
    a semiconductor substrate;
    a core logic region formed on the substrate;
    process monitor circuitry formed on the substrate, the process monitor circuitry comprising:
        an input bond pad;
        an output bond pad, the input and output bond pads disposed on opposing sides of the core logic region; and
        a plurality of logic gates disposed in the core logic region and coupled in series between the input bond pad and the output bond pad to form a first test path, the first test path providing output pulses at the output bond pad in response to input pulses at the input bond pad, the output pulses including information representative of the relative electrical characteristics of the first type of transistor and the second type of transistor.

14. The integrated circuit of claim 13, wherein the plurality of logic gates comprise logic gates disposed across the integrated circuit die at predetermined intervals to provide the information representative of the relative electrical characteristics of the first type of transistor and the second type of transistor for at least two regions of the integrated circuit.

15. The integrated circuit of claim 13, the process monitor circuitry further comprising:
    a second test path disposed in a generally perpendicular arrangement with the first test path.

16. The integrated circuit of claim 15, the process monitor circuitry further comprising:
    a plurality of additional test paths, at least one of the additional test paths arranged in a generally parallel manner to the first test path, and at least one of the additional test paths arranged in a generally parallel manner to the second test path.

17. A method for monitoring a semiconductor manufacturing process having at least first and second types of transistors for forming logic gates, the semiconductor process further utilizing multiple layers of interconnect material to form interconnect wires for signal paths between circuit components, the method comprising the steps of:

providing an integrated circuit having a core logic portion and a plurality of bond pads, the integrated circuit further having process monitor circuitry, the process monitor circuitry comprising an input bond pad and an output bond pad, the input and output bond pads disposed on opposing sides of the core logic region, and a plurality of logic gates disposed in the core logic region and coupled in series between the input bond pad and the output bond pad to form a test path, the test path providing output pulses at the output bond pad in response to input pulses at the input bond pad, the output pulses including information representative of the relative electrical characteristics of the first type of transistor and the second type of transistor;

applying a test pattern to the input bond pad of the process monitor circuitry;

recording the resulting output pulses of the process monitor circuitry; and comparing the output pulses of the process monitor circuitry to predetermined test values reflecting acceptable process variations.

18. The method of claim 17, wherein the predetermined test values are determined by three dimensional device-level simulations including simulation values reflecting process variations.

19. The method of claim 17, wherein the step of comparing is performed by automated test equipment.

20. The method of claim 17, wherein the process monitor circuitry further comprises a plurality of additional test paths, at least one of the additional test paths arranged in a generally parallel manner to the first test path, and at least one of the additional test paths arranged in a generally parallel manner to the second test path, the method further comprising the steps of:

applying a test pattern to the input bond pads of the additional test paths;

recording the resulting output pulses of the additional test paths; and comparing the output pulses of the additional test paths to predetermined test values reflecting acceptable process variations.

21. The method of claim 17, wherein the process monitor further comprises a multiplexing circuit coupled between the input bond pad and the plurality of logic gates of the test path, the multiplexing circuit responsive to assertion of an enable signal to provide signals at the input bond pad to the plurality of logic gates, the multiplexing circuit otherwise providing signals at the input bond pad to other logic gates of the integrated circuit, the method further comprising the step of:

asserting the enable signal to the multiplexing circuit prior to the step of applying a test pattern to the input bond pads of the test path.

\* \* \* \* \*